United States Patent
Masuda et al.

(10) Patent No.: US 6,529,102 B2
(45) Date of Patent: Mar. 4, 2003

(54) LC FILTER CIRCUIT AND LAMINATED TYPE LC FILTER

(75) Inventors: Hiroshi Masuda, Shiga-ken (JP); Noboru Kato, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/935,252

(22) Filed: Aug. 22, 2001

(65) Prior Publication Data

US 2002/0030561 A1 Mar. 14, 2002

(30) Foreign Application Priority Data

Sep. 12, 2000 (JP) .......................................... 2000-276749

(51) Int. Cl.$^7$ .................................................. H03H 7/01
(52) U.S. Cl. .......................... 333/177; 333/185; 333/176
(58) Field of Search .................................. 333/175, 177, 333/202, 132, 134, 176, 185; 343/702, 722; 455/462; 324/318, 322; 331/117 R; 363/91; 323/222

(56) References Cited

U.S. PATENT DOCUMENTS

| 4,496,952 | A | * | 1/1985 | Newcomb .................... 343/722 |
| 4,742,304 | A | * | 5/1988 | Schnall et al. ............... 324/318 |
| 4,795,990 | A | * | 1/1989 | Ishikawa et al. ............. 333/176 |
| 6,091,309 | A | * | 7/2000 | Burke et al. ............. 331/117 R |
| 6,097,268 | A | * | 8/2000 | Watanabe et al. ........... 333/132 |
| 6,229,489 | B1 | * | 5/2001 | Holshouser et al. ........ 343/702 |
| 6,400,154 | B2 | * | 6/2002 | Tomanek et al. ........... 324/318 |
| 6,411,178 | B1 | * | 6/2002 | Matsumura et al. ........ 333/134 |

FOREIGN PATENT DOCUMENTS

| JP | 08-023208 | 1/1996 |
| JP | 09-153703 | 6/1997 |

* cited by examiner

Primary Examiner—Patrick Wamsley
(74) Attorney, Agent, or Firm—Keating & Bennett, llp

(57) ABSTRACT

Two LC resonance circuits, each including a parallel combination of an inductor and a capacitor and both magnetically coupled, are connected between an input terminal and an output terminal, and a parallel resonance trap circuit including a parallel combination of an inductor and a capacitor is connected in series between at least either the input terminal, the output terminal and the LC resonance circuit.

19 Claims, 3 Drawing Sheets

LC FILTER CIRCUIT AND LAMINATED TYPE LC FILTER

BACKGROUND OF THE INVENTION

1. Field of the Invention

The present invention relates to an LC filter circuit and a laminated type LC filter.

2. Description of the Related Art

Among such LC filter circuits, for example, there is a bandpass filter having a circuit that is equivalent to that shown in FIG. 4. That is, an LC resonance circuit Q1, in which an inductor L1 and a capacitor C1 are connected in parallel, is connected between an input terminal P1 and a ground terminal. In the same manner, an LC resonance circuit Q2, in which an inductor L2 and a capacitor C2 are connected in parallel, is connected between an output terminal P2 and a grounding terminal. Then, between the inductor L1 and the inductor L2, a mutual inductance M is generated, and the resonance circuits Q1 and Q2 are magnetically coupled.

Furthermore, a series resonance trap circuit, in which an inductor L3 and a capacitor C3 are connected in series, is connected between the input terminal P1 and a grounding terminal, and a series resonance trap circuit, in which an inductor L4 and a capacitor C4 are connected in series, is connected between the output terminal P2 and a grounding terminal. Moreover, a coupling capacitor C5 is connected between the input and output terminals P1 and P2.

As described above, in the conventional LC filter circuit, the series resonance trap circuit is connected to each of the input and output terminals so as to be in parallel to the LC resonance circuit, and in such a series resonance trap circuit, a problem occurs in that the attenuation value is low and also that the frequency band is narrow.

SUMMARY OF THE INVENTION

In order to overcome the problems described above, preferred embodiments of the present invention provide an LC filter circuit and a laminated type LC filter in which a sufficient attenuation value and frequency band are achieved.

In a preferred embodiment of the LC filter circuit of the present invention, at least two LC resonance circuits, each including a parallel combination of an inductor and a capacitor and both magnetically coupled, are connected between an input terminal and an output terminal, and a parallel resonance trap circuit including a parallel combination of an inductor and a capacitor is connected in series between at least either the input terminal, the output terminal and the LC resonance circuit.

An attenuation value and frequency band required for a desired frequency can be achieved by connecting the parallel resonance trap circuit including a parallel combination of an insulator and a capacitor.

Furthermore, in the LC filter circuit of a preferred embodiment of the present invention, the parallel resonance trap circuits are preferably connected in series between the input terminal and the LC resonance circuit and between the output terminal and the LC resonance circuit, respectively. A higher attenuation value is achieved by providing the parallel resonance trap circuit on both sides.

Next, in the laminated type LC filter including therein the LC filter circuit according to the above-described preferred embodiment of the present invention, at least two LC resonators, each including a parallel combination of an inductor electrode and a capacitor electrode, one end of which is connected to an input-output terminal and the other end of which is connected to a grounding terminal, both being magnetically coupled, are provided inside a laminated body in which dielectric layers are stacked on top of one another, and a parallel resonance trap circuit including a parallel combination of an inductor electrode and a capacitor electrode, connected in series between at least one of the LC resonators and an input-output terminal, is provided inside the laminated body.

The laminated type LC filter is miniaturized by constructing the above-described LC filter circuit as a integral, unitary chip component.

Furthermore, in the laminated type LC filter of preferred embodiments of the present invention, the parallel resonance trap circuits are preferably connected in series between the input-output terminals and the LC resonators, respectively. When constructed in this way, a higher attenuation value is achieved.

Furthermore, in the laminated type LC filter of preferred embodiments of the present invention, when the parallel resonance trap circuits are connected, a shield electrode is preferably provided between the inductor electrodes of the parallel resonance trap circuits.

When constructed as described above, since the magnetic field generated by each inductor electrode is shielded by a shield electrode, the interference between the magnetic field of the inductor electrodes is minimized and adverse effects to the transmission characteristic are prevented.

Furthermore, in a laminated type LC filter of preferred embodiments of the present invention, a shield electrode is provided between the inductor electrode of the LC resonator and the inductor electrode of the parallel resonance trap circuit.

When constructed as described above, since the magnetic field generated by each inductor electrode is shielded by a shield electrode, the interference between the magnetic field of the inductor electrodes is minimized and the laminated type LC filter effectively functions as a trap circuit.

Other features, elements, advantages and characteristics of the present invention will become more apparent from the following detailed description of preferred embodiments thereof with reference to the attached drawings.

BRIEF DESCRIPTION OF THE DRAWINGS

FIG. 3A is an exploded perspective view of the laminated type LC filter, and FIG. 3B is a perspective view of the laminated type LC filter.

DETAILED DESCRIPTION OF PREFERRED EMBODIMENTS

In the following, preferred embodiments of an LC filter circuit and a laminated type LC filter of the present invention is described.

Figure 1:
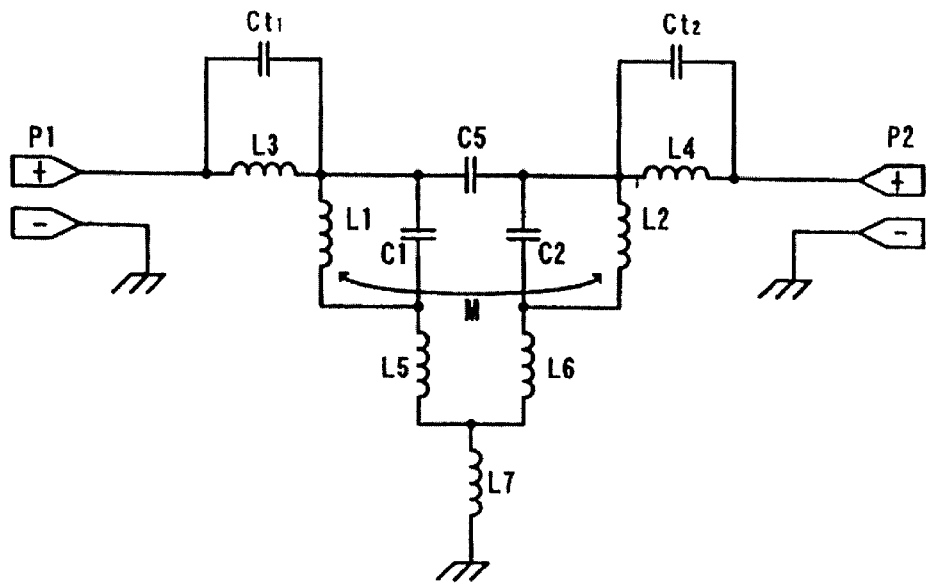
FIG. 1 is an equivalent circuit diagram of an LC filter circuit according to a preferred embodiment of the present invention.
Figure 2:
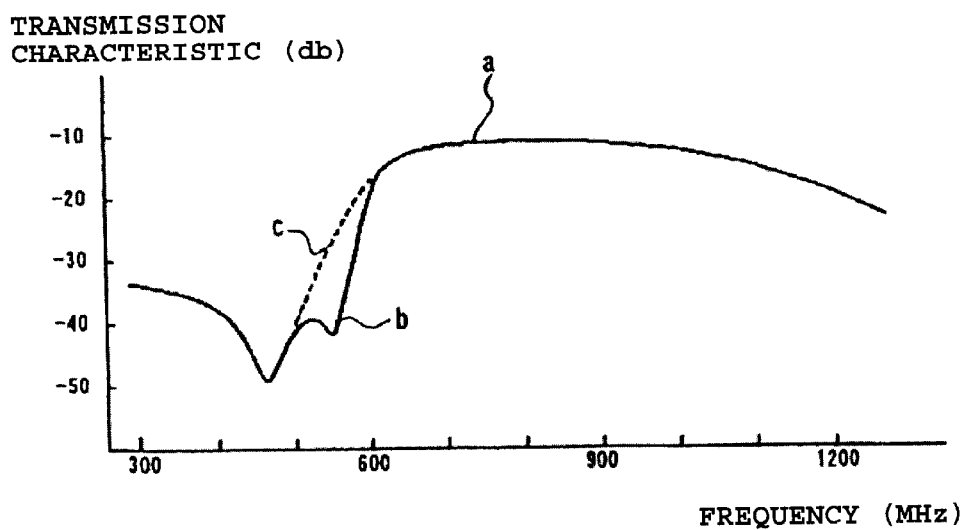
FIG. 2 is a graph showing the frequency characteristics of the LC filter circuit in FIG. 1.
Figures 3A, 3B:
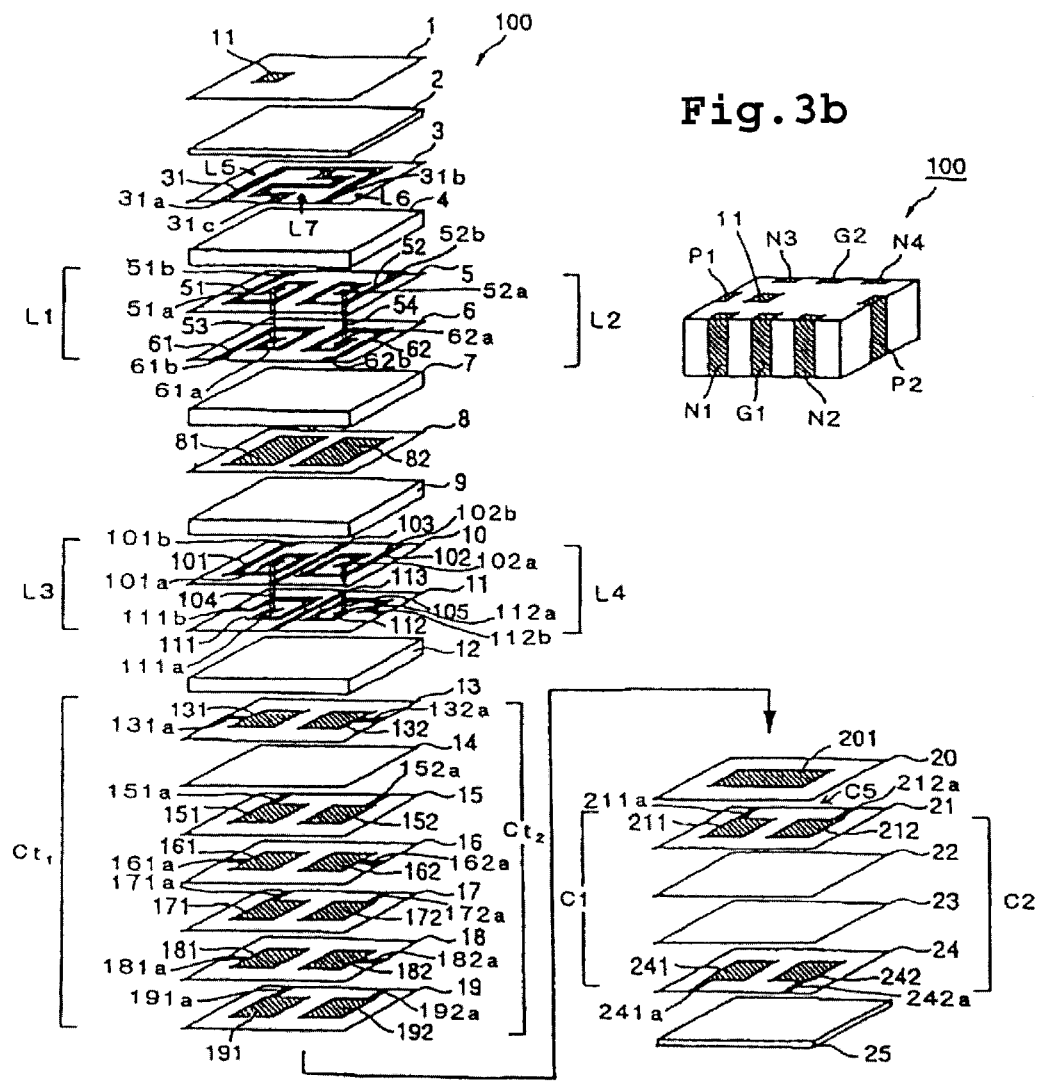
FIGS. 3A and 3B show a preferred embodiment of a laminated type LC filter constituting the LC filter circuit in FIG. 1.
Figure 4:
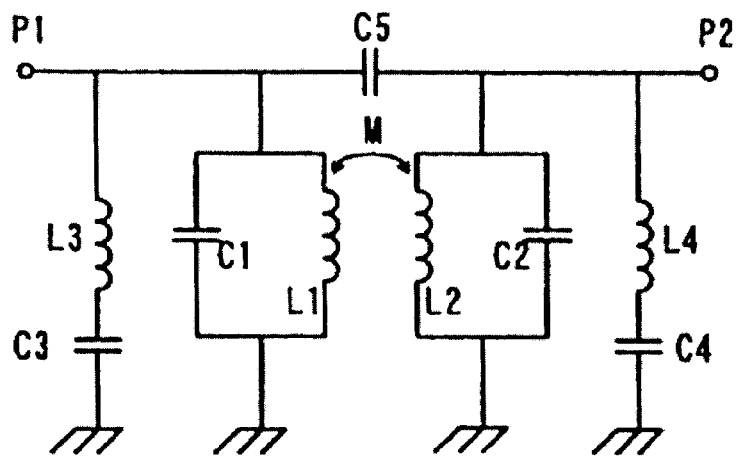
FIG. 4 is an equivalent circuit diagram of a conventional LC filter circuit.

FIG. 1 is an LC filter circuit according to a preferred embodiment of the present invention and FIG. 2 shows its frequency characteristics. FIGS. 3A and 3B show a preferred embodiment of the laminated type LC filter constituting the LC filter circuit in FIG. 1, FIG. 3A is an exploded perspective view of the laminated type LC filter, and FIG. 3B is an external perspective view.

As shown in FIG. 1, in the LC filter circuit of various preferred embodiments of the present invention, an LC resonance circuit Q1, in which an inductor L1 and a capacitor C1 are connected in parallel, is connected between an input-output terminal P1 and a grounding terminal, and in the same way, an LC resonance circuit Q2, in which an inductor L2 and a capacitor C2 are connected in parallel, is connected between an input-output terminal P2 and the grounding terminal. Then, between the inductors L1 and L2, a mutual inductance M is created, and the LC resonance circuits Q1 and Q2 are magnetically coupled.

Furthermore, a parallel resonance trap circuit, in which an inductor L3 and a capacitor Ct1 are connected in parallel, is connected between the input-output terminal P1 and the LC resonance circuit Q1. In the same way, a parallel resonance trap circuit, in which an inductor L4 and a capacitor Ct2 are connected in parallel, is connected between the input-output terminal P2 and the LC resonance circuit Q2.

Furthermore, a coupling capacitor C5 is connected between the input-output terminal P1 and the input-output terminal P2. Moreover, inductors L5, L6, and L7 are connected between the LC resonance circuits Q1 and Q2 and the grounding terminal.

The LC filter circuit constructed as described above constitutes a bandpass filter circuit in which the LC resonance circuits Q1 and Q2 are magnetically coupled, and an attenuation pole having a high value is simultaneously generated in the vicinity of the center frequency by the parallel resonance trap circuits.

In FIG. 2, the frequency characteristics of such an LC filter circuit are shown. In FIG. 2, where curve "a" represents the transmission characteristics, the attenuation pole shown by "b" is generated by the parallel resonance trap circuits connected between the input-output terminals P1 and P2 and the LC resonance circuits, and thus it is possible to achieve a sufficient attenuation value and frequency band. Moreover, the inductors L5, L6, and L7 adjust the location of the attenuation pole. Curve "c" in FIG. 2 represents the transmission characteristics when the parallel resonance trap circuits are not provided.

Next, a preferred embodiment of the laminated type LC filter constituting such an LC filter circuit is described.

As shown in FIG. 3A, the laminated type LC filter includes a laminated body 100 in which dielectric sheets 1 to 25 are integrally laminated. The dielectric sheet 1 constitutes the uppermost layer and an identification mark 11 showing the direction of mounting is formed on its surface.

The dielectric sheet 2 is a dummy sheet provided for thickness adjustment and no electrode is provided on its surface.

On the dielectric sheet 3, an inductor electrode 31 constituting the inductors L5, L6, and L7 is provided on the surface. The inductor electrode 31 preferably includes three parts, and one end of each part 31a, 31b, or 31c is exposed on the front side of the dielectric sheet 3 and the other end of each part is connected to the other parts on the rear side. The inductors L5 and L6 preferably have a substantially L-shaped configuration and the inductor L7 is preferably arranged to have a meandering configuration.

The dielectric sheet 4 is a dummy sheet having no electrode provided on its surface and is thicker than the dielectric sheet 2 so that the inductors L5 to L7 do not magnetically influence the inductors L1 and L2, as described later.

On the dielectric sheets 5 and 6, inductor electrodes 51, 52, 61, and 62, which are positioned to be substantially parallel to each other, are spirally configured. One end 51a of the inductor electrode 51 and one end 61a of the inductor electrode 61 are electrically connected through a via hole 53 to constitute the inductor L1. In the same way, one end 52a of the inductor electrode 52 and one end 62a of the inductor electrode 62 are electrically connected through a via hole 54 to constitute the inductor L2. Furthermore, the other end 61b of the inductor electrode 61 and the other end 62b of the inductor electrode 62 are exposed on the front side of the dielectric sheet 6, and the other end 51b of the inductor electrode 51 and the other end 52b of the inductor electrode 52 are exposed on the rear side of the dielectric sheet 5.

The dielectric sheet 7 is a dummy sheet having no electrode provided on its surface and preferably has substantially the same thickness as the dielectric sheet 4 so that shield electrodes 81 and 82, to be described later, do not magnetically influence the inductors L1 and L2.

On the dielectric sheet 8, the two shield electrodes 81 and 82 are arranged so that the inductors L1 and L2 do not magnetically interfere with inductors L3 and L4 to be described later, and vice versa. These shield electrodes 81 and 82 preferably include substantially rectangular floating electrodes and are arranged about the area of the external shape of the inductor electrodes 61 and 62 (the lead-out portions are excluded).

The electrode sheet 9 is a dummy sheet having no electrode provided on its surface and is arranged so as to have substantially the same thickness as the dielectric sheet 7 so that the shield electrodes 81 and 82 do not magnetically influence inductor electrodes 101 and 102 to be described later.

On the dielectric sheets 10 and 11, inductor electrodes 101, 102, 111, and 112, which are arranged in parallel, are spirally configured. One end 101a of the inductor electrode 101 and one end 111a of the inductor electrode 111 are electrically connected through a via hole 104 to constitute the inductor L3. In the same way, one end 102a of the inductor electrode 102 and one end 112a of the inductor electrode 112 are electrically connected through a via hole 105 to constitute the inductor L4. Furthermore, the other end 111b of the inductor electrode 111 and the other end 112b of the inductor electrode 112 are exposed on the left and right sides of the dielectric sheet 11, and the other end 101b of the inductor electrode 101 and the other end 102b of the inductor electrode 102 are exposed on the rear side of the dielectric sheet 10.

Furthermore, linear shield electrodes 103 and 113 extending from the front side to the rear side of the dielectric sheets 10 and 11 are disposed between the inductor electrodes 101 and 102, and 111 and 112 on the same dielectric layer, respectively, and the inductors L3 and L4 are shielded so as not to interfere with each other.

The electrode sheet 12 is a dummy sheet having no electrode disposed on its surface and preferably has substantially the same thickness as the dielectric sheet 9 so that capacitor electrodes 131 and 132, to be described later, do not magnetically influence the inductors L3 and L4.

On the dielectric sheet 13, the capacitor electrodes 131 and 132 on the input-output side are disposed on the surface, and the lead-out portion 131a is exposed at the left side and the lead-out portion 132a is exposed at the right side.

The dielectric sheet 14 has a fixed thickness so that capacitance between capacitor electrodes 151 and 152 to be described later is adjusted, and no electrode is provided on the surface.

On the dielectric sheet 15, the capacitor electrodes 151 and 152 on the resonator side are provided on the surface, and both lead-out portions 151a and 152a are exposed on the rear side.

On the dielectric sheet 16, capacitor electrodes 161 and 162 on the input-output side are provided on the surface, and the lead-out portions 161a and 162a are exposed on the left and right sides.

On the dielectric sheet 17, capacitor electrodes 171 and 172 on the resonator side are provided on the surface, and both lead-out portions 171a and 172a are exposed on the rear side.

On the dielectric sheet 18, capacitor electrodes 181 and 182 on the input-output side are provided on the surface, and lead-out portions 181a and 182a are exposed on the left and right sides.

On the dielectric sheet 19, capacitor electrodes 191 and 192 on the resonator side are provided on the surface, and both lead-out portions 191a and 192a are exposed on the rear side.

Accordingly, the capacitor Ct1, in which the capacitor electrodes 131, 161, and 181 on the input-output side are opposed to the capacitor electrodes 151, 171, and 191 on the resonator side through the dielectric sheets, defines capacitance in a wave trap. In the same way, the capacitor Ct2, in which the capacitor electrodes 132, 162, and 182 on the input-output side are opposed to the capacitor electrodes 152, 172, and 192 on the resonator side through the dielectric sheets, defines capacitance in a wave trap.

On the dielectric sheet 20, a coupling capacitor electrode 201 is disposed on the surface and preferably has a substantially rectangular shape having longer sides extending in the left and right directions. The capacitor electrode 201, which is opposed to the capacitor electrodes 191 and 192 and capacitor electrodes 211 and 212, to be described later, through the dielectric sheets 19 and 20, constitutes the coupling capacitor C5.

On the dielectric sheet 21, capacitor electrodes 211 and 212 are located on the parallel resonance trap circuit side of the capacitors C1 and C2, and lead-out portions 211a and 212a are exposed on the rear side.

The dielectric sheets 22 and 23 preferably have a fixed thickness so that capacitance is adjusted between the capacitor electrodes 211 and 212 and capacitor electrodes 241 and 242 on the grounding side to be described later, and no electrodes are provided on the their surfaces.

On the dielectric sheet 24, the capacitor electrodes 241 and 242 are located on the grounding side of the capacitors C1 and C2, and lead-out portions 241a and 242a are exposed on the front side.

The dielectric sheet 25 constitutes the lowermost layer and preferably has substantially the same thickness as that of the dielectric sheet 2.

Each electrode is preferably made of one or more of Ag, Pd, Cu, Ni, Au, Ag—Pd, or other suitable material, and is preferably formed by printing, sputtering, evaporation, or other suitable method. Furthermore, a dielectric powder kneaded with a binder, or other suitable material, is formed into sheets and they are used as the dielectric sheets 1 to 25.

After each dielectric sheet constructed as described above has been stacked in order, they are integrally fired to form a laminated body 100. Next, as shown in FIG. 3B, the grounding electrodes G1 and G2 and relay electrodes N1, N2, N3, and N4 are formed on the front surface and the rear surface of the resulting laminated body, and an input-output terminal P1 and an input-output terminal P2 are formed on the left and right side surfaces of the laminated body so as to constitute external electrodes, respectively. Each external electrode is preferably formed by coating and baking, sputtering, evaporation, or other suitable method.

Then, the other end 31c of the inductor electrode 31 and one end of 103a and 113a of the shield electrodes 103 and 113 are connected to the grounding electrode G1. The other ends 103b and 113b of the shield electrodes 103 and 113 are connected to the grounding electrode G2. Furthermore, the one end 31a of the inductor electrode 31, the one end 61a of the inductor electrode 61, and the lead-out portion 241a of the capacitor electrode 241 are connected to the relay electrode N1. The one end 31b of the inductor electrode 31, the one end 62a of the inductor electrode 62, and the lead-out portion 242a of the capacitor electrode 242 are connected to the relay electrode N2. The one end 51a of the inductor electrode 51, the one end 101a of the inductor electrode 101, the lead-out portions 151a, 171a, and 191a of the capacitor electrodes 151, 171, and 191, and the lead-out portion 211a of the capacitor electrode 211 are connected to the relay electrode N3. Moreover, the one end 52a of the inductor electrode 52, the one end 102a of the inductor electrode 102, the lead-out portions 152a, 172a, and 192a of the capacitor electrodes 151, 171, and 191, and the lead-out portion 212a of the capacitor electrode 212 are connected to the relay electrode N4.

Moreover, the LC filter circuit and laminated type LC filter according to the present invention are not limited to the above-described preferred embodiments, and they can be changed and modified within the true spirit and scope of the present invention.

In the above-described preferred embodiments, the capacitor in a trap circuit is constructed in such a way that a plurality of capacitor electrodes on the input-output side and capacitor electrodes on the resonator side are opposed to each other, but when the capacitor has a desired capacitance, the number of capacitor electrodes does not matter.

Furthermore, the relay electrodes are not necessarily required to be located on the side surfaces of the laminated body, and the relay electrodes may be provided inside the laminated body by making use of electrical connection elements such as via holes or other suitable connectors.

Furthermore, in the above-described preferred embodiment, after the dielectric sheets have been stacked on top of one another, they are integrally sintered, but this is not necessarily the only way of forming the device. For example, a laminated type LC filter may be manufactured by a manufacturing method as described below. After a dielectric film has been formed by coating and drying the paste of a dielectric material via printing, or other suitable method, an electrode film is formed by coating and drying the paste of a conductive material on the surface of the dielectric film. In this way, an LC filter having a laminated construction can be obtained by applying the coats in layers in order. Moreover, a resin film or other insulators may be used as the dielectric sheet 2, and dielectric materials which are sintered in advance may also be used.

As described above, according to the LC filter circuit of various preferred embodiments of the present invention, since a parallel resonance trap circuit is connected in series between at least either of the input-output terminals and the LC resonator, an attenuation value necessary for a desired frequency can be achieved without deterioration of the insertion loss.

Furthermore, according to the laminated LC filter of various preferred embodiments of the present invention, miniaturization of the laminated LC filter is possible by constructing the LC filter circuit using a single, unitary chip component.

While the present invention has been particularly shown and described with reference to preferred embodiments thereof, it will be understood by those skilled in the art that the foregoing and other changes in form and details can be made without departing from the spirit and scope of the invention.

What is claimed is:

1. An LC filter circuit comprising:
   at least two LC resonance circuits each including a parallel combination of an inductor and a capacitor, the at least two LC resonance circuits being magnetically coupled to each other and connected between an input terminal and an output terminal; and
   at least one parallel resonance trap circuit including a parallel combination of an inductor and a capacitor, the at least one parallel resonance trap circuit being connected in series between the input terminal and the at least two LC resonance circuits or connected in series between the output terminal and the at least two LC resonance circuits.

2. The LC filter circuit according to claim 1, further comprising a laminated body including a plurality of stacked dielectric layers, wherein the at least two LC resonance circuits and the at least one parallel resonance trap circuit are disposed within the laminated body.

3. The LC filter circuit according to claim 2, wherein a plurality of inductors are provided on at least one of the dielectric layers.

4. The LC filter circuit according to claim 2, wherein a plurality of shield electrodes are provided on at least one of the dielectric layers.

5. The LC filter circuit according to claim 2, wherein a plurality of capacitor electrodes are provided on at least one of the dielectric layers.

6. The LC filter circuit according to claim 1, further comprising a plurality of inductors connected between the at least two LC resonance circuits and the grounding terminal.

7. The LC filter circuit according to claim 1, wherein the at least two LC resonance circuits and the at least one parallel resonance trap circuit are arranged to constitute a bandpass filter.

8. The LC filter circuit according to claim 1, wherein the at least one parallel resonance trap circuit is connected in series between the input terminal and the at least two LC resonance circuits and connected in series between the output terminal and the at least two LC resonance circuits.

9. The LC filter circuit according to claim 1, wherein a plurality of the parallel resonance trap circuits are connected in series between the input terminal and the at least two LC resonance circuits and between the output terminal and the at least two LC resonance circuits, respectively.

10. A laminated type LC filter comprising:
    a laminated body including a plurality of stacked dielectric layers;
    at least two LC resonators each including a parallel combination of an inductor electrode and a capacitor electrode, one end of which is connected to an input-output terminal and the other end of which is connected to a grounding terminal, and the at least two LC resonators being magnetically coupled to each other and provided inside the laminated body; and
    at least one parallel resonance trap circuit provided inside the laminated body and including a parallel combination of an inductor electrode and a capacitor electrode, the at least one parallel resonance trap circuit being connected in series between an input-output terminal and the at least two LC resonators or connected in series between an input-output terminal and the at least two LC resonators.

11. The LC filter circuit according to claim 10, wherein the at least one parallel resonance trap circuit is connected in series between the input terminal and the at least two LC resonance circuits and connected in series between the output terminal and the at least two LC resonance circuits.

12. The laminated type LC filter according to claim 10, wherein a plurality of the parallel resonance trap circuits are connected in series between the input-output terminals and the at least two LC resonators, respectively.

13. The laminated type LC filter according to claim 12, wherein when the plurality of parallel resonance trap circuits are connected, a shield electrode is provided between inductor electrodes of the plurality of parallel resonance trap circuits.

14. The laminated type LC filter according to claim 10, wherein a shield electrode is provided between an inductor electrode of the at least two LC resonators and an inductor electrode of the at least one parallel resonance trap circuit.

15. The LC filter circuit according to claim 10, further comprising a plurality of inductors connected between the at least two LC resonance circuits and the grounding terminal.

16. The LC filter circuit according to claim 10, wherein the at least two LC resonance circuits and the at least one parallel resonance trap circuit are arranged to constitute a bandpass filter.

17. The LC filter circuit according to claim 10, wherein a plurality of inductors are provided on at least one of the dielectric layers.

18. The LC filter circuit according to claim 10, wherein a plurality of shield electrodes are provided on at least one of the dielectric layers.

19. The LC filter circuit according to claim 10, wherein a plurality of capacitor electrodes are provided on at least one of the dielectric layers.

* * * * *